(12) United States Patent
Sakui et al.

(10) Patent No.: US 12,369,303 B2
(45) Date of Patent: Jul. 22, 2025

(54) MEMORY DEVICE INCLUDING SEMICONDUCTOR ELEMENT

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 171 days.

(21) Appl. No.: 18/484,048

(22) Filed: Oct. 10, 2023

(65) Prior Publication Data

US 2024/0130105 A1  Apr. 18, 2024

(30) Foreign Application Priority Data

Oct. 12, 2022  (WO) .................. PCT/JP2022/038066

(51) Int. Cl.
  *G11C 11/34* (2006.01)
  *G11C 11/404* (2006.01)
  (Continued)

(52) U.S. Cl.
  CPC ............ *H10B 12/20* (2023.02); *G11C 11/404* (2013.01); *G11C 11/4096* (2013.01)

(58) Field of Classification Search
  CPC .... H10B 12/20; G11C 11/404; G11C 11/4096
  (Continued)

(56) References Cited

U.S. PATENT DOCUMENTS

| 11,682,443 B2 * | 6/2023 | Sakui | ................. | G11C 14/0018 |
| | | | | 365/184 |
| 11,763,877 B2 * | 9/2023 | Sakui | ..................... | G11C 7/04 |
| | | | | 365/185.29 |

(Continued)

FOREIGN PATENT DOCUMENTS

| JP | H02188966 A | 7/1990 |
| JP | H03171768 A | 7/1991 |

(Continued)

OTHER PUBLICATIONS

International Search Report and Written Opinion (Japanese and English Translation) in PCT/JP2022/038066, dated Dec. 9, 2022 (13 pages).

(Continued)

*Primary Examiner* — Viet Q Ngyen
(74) *Attorney, Agent, or Firm* — Crowell & Moring LLP

(57) ABSTRACT

A memory device includes a plurality of pages arrayed in a column direction in a plan view, each page being constituted by a plurality of memory cells arrayed in a row direction on a substrate. Each of the memory cells included in each of the pages includes a semiconductor base material, first and second impurity regions positioned at respective ends of the semiconductor base material, first, second, and third gate conductor layers. The first and second impurity regions, the first, second, and third gate conductor layers are connected to a source line, a bit line, a first select gate line, a plate line, and a second select gate line, respectively. Upon operation end of page write operation and page read operation, voltage of the plate line is set to negative voltage lower than 0 V through capacitive coupling of the plate line and each of the first and second select gate lines to improve data retention characteristics of a write memory cell.

15 Claims, 11 Drawing Sheets

(51) Int. Cl.
  *G11C 11/4096* (2006.01)
  *H10B 12/00* (2023.01)
(58) Field of Classification Search
  USPC .......................................................... 365/184
  See application file for complete search history.

(56) References Cited

U.S. PATENT DOCUMENTS

| | | | | |
|---|---|---|---|---|
| 11,823,727 | B2* | 11/2023 | Sakui | G11C 16/14 |
| 11,917,807 | B2* | 2/2024 | Sakui | H10D 30/711 |
| 11,937,418 | B2* | 3/2024 | Sakui | G11C 11/4091 |
| 11,990,204 | B2* | 5/2024 | Sakui | G11C 11/404 |
| 11,996,136 | B2* | 5/2024 | Sakui | G11C 16/3418 |
| 12,100,443 | B2* | 9/2024 | Sakui | G11C 16/24 |
| 12,108,589 | B2* | 10/2024 | Sakui | H10B 12/05 |
| 12,131,773 | B2* | 10/2024 | Sakui | G11C 16/10 |
| 12,277,962 | B2* | 4/2025 | Shirota | H10B 12/20 |
| 2003/0111681 | A1 | 6/2003 | Kawanaka | |
| 2008/0137394 | A1 | 6/2008 | Shimano et al. | |
| 2023/0377635 | A1 | 11/2023 | Sakui et al. | |
| 2024/0206151 | A1* | 6/2024 | Sakui | G11C 11/4096 |

FOREIGN PATENT DOCUMENTS

| | | | |
|---|---|---|---|
| JP | 7057032 B1 | 4/2022 | |
| WO | WO 2022/168158 A1 | 8/2022 | |

OTHER PUBLICATIONS

Takato, H., et al., "Impact of Surrounding Gate Transistor (SGT) for Ultra-High-Density LSI's", *IEEE Transactions on Electron Devices*, vol. 38, No. 3, Mar. 1991, pp. 573-578 (6 pages).

Chung, H., et al., "Novel 4F² DRAM Cell with Vertical Pillar Transistor(VPT)" 2011 *Proceedings of the European Solid-State Device Research Conference* (2011) (4 Pages).

Wong, H.S., P., et al., "Phase Change Memory" *Proceedings of the IEEE*, vol. 98, No. 12, Dec. 2010, pp. 2201-2227 (27 pages).

Tsunoda, K., et al., "Low Power and High Speed Switching of Ti-doped NiO ReRAM under the Unipolar Voltage Source of less than 3 V" IEDM (2007) pp. 767-770, (4 pages).

Kang, W., et al., "Reconfigurable Codesign of STT-MRAM Under Process Variations in Deeply Scaled Technology" *IEEE Transactions on Electron Devices*, vol. 62, No. 6, Jun. 2015, pp. 1769-1777 (9 pages).

Ertosun, M. G., et al., "Novel Capacitorless Single-Transistor Charge-Trap DRAM 1T CT DRAM) Utilizing Electrons" *IEEE Electron Device Letters*, vol. 31, No. 5, May 2010, pp. 405-407 (3 pages).

Wan, J., et al., "A Compact Capacitor-Less High-Speed DRAM Using Field Effect-Controlled Charge Regeneration" *IEEE Electron Device Letters*, vol. 33, No. 2, Feb. 2012, pp. 179-181 (3 pages).

Ohsawa, T., et al., "Memory Design Using a One-Transistor Gain Cell on SOI", *IEEE Journal of Solid-State Circuits*, vol. 37, No. 11, Nov. 2002 (13 pages).

Shino, T., et al., "Floating Body RAM Technology and its Scalability to 32nm Node and Beyond", IEEE IEDM (2006) (4 pages).

Song, J., et al., "Design Optimization of Gate-All-Around (GAA) MOSFETs" *IEEE Transactions on Nanotechnology*, vol. 5, No. 3, pp. 186-191, May 2006 (7 pages).

Loubet, N., et al., "Stacked Nanosheet Gate-All-Around Transistor to Enable Scaling Beyond FinFET" *2017 Symposium on VLSI Technology Digest of Technical Papers*, T230-T231, Jun. 2017 (2 pages).

Jiang, H., et al., "Experimental Investigation of Self-Heating Effect (SHE) in Multiple-Fin SOI FinFETS" *Semicond. Sci. Technol.* 29 (2014) 115021 (9 pages).

Morishita, F., et al., "A Capacitorless Twin-Transistor Random Access Memory (TTRAM) on SOI" *IEICE Trans. Electron*, vol. E90-C, No. 4, Apr. 2007, pp. 765-771 (7 pages).

Sakui, K., et al., "Dynamic Flash Memory with Dual Gate Surrounding Gate Transistor (SGT) for Computation In Memory" *Proc. IEEE IMW*, pp. 127-128 (2021) (2 pages).

Yoshida, E., et al., "A Design of a Capacitorless 1T-DRAM Cell Using Gate-induced Drain Leakage (GIDL) Current for Low-power and High-speed Embedded Memory", *IEEE IEDM*, pp. 913-916 (2003) (4 pages).

Ohsawa, T., "SOI DRAM with One-Transistor FET Cell," Oyo Buturi, vol. 75, No. 9, pp. 1131-1135 (2006) (9 pages).

\* cited by examiner

FIG. 2A     "1" WRITTEN STATE
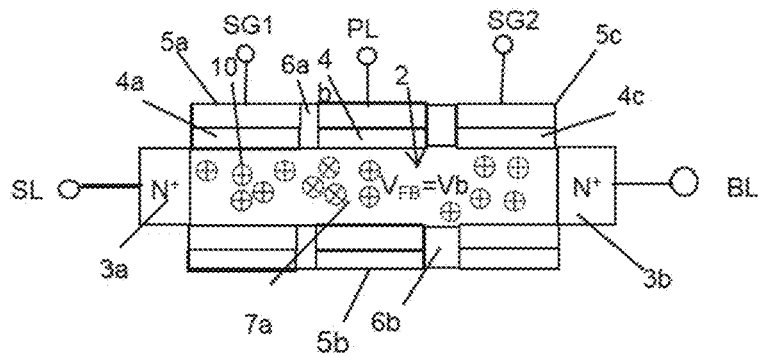
FIG. 2B     "0" ERASE OPERATION
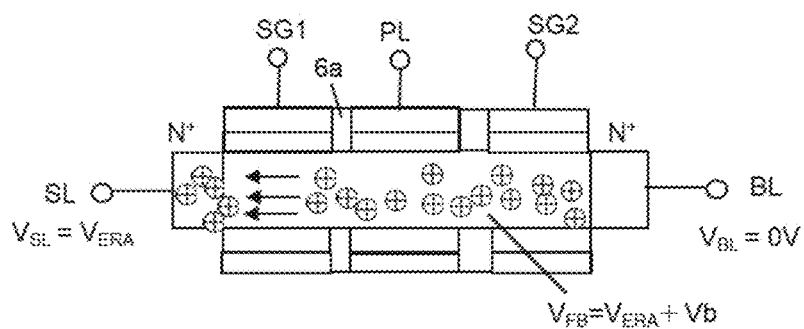
Vb: Built-in Voltage~0.7V
FIG. 2C
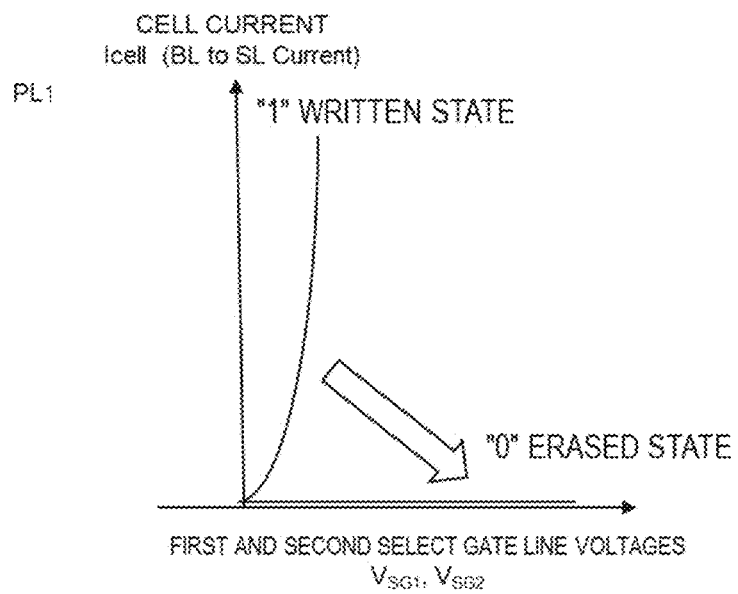

FIG. 3A   "1" WRITE OPERATION
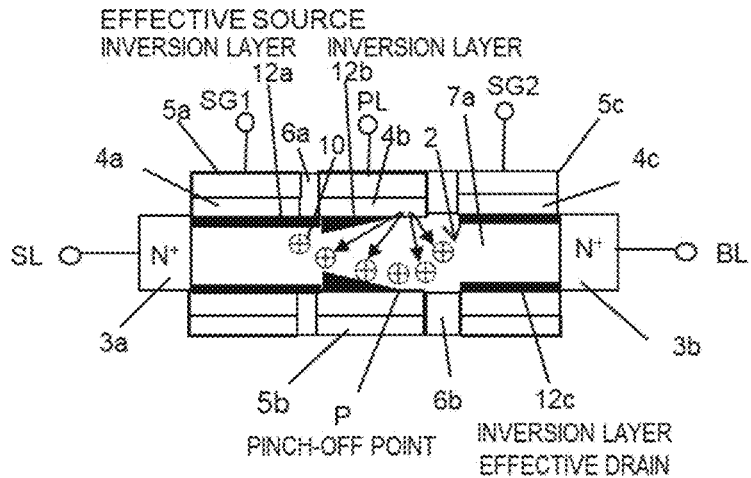
FIG. 3B   "1" WRITTEN STATE
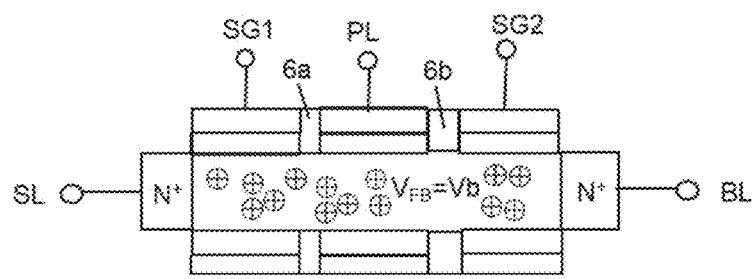
FIG. 3C
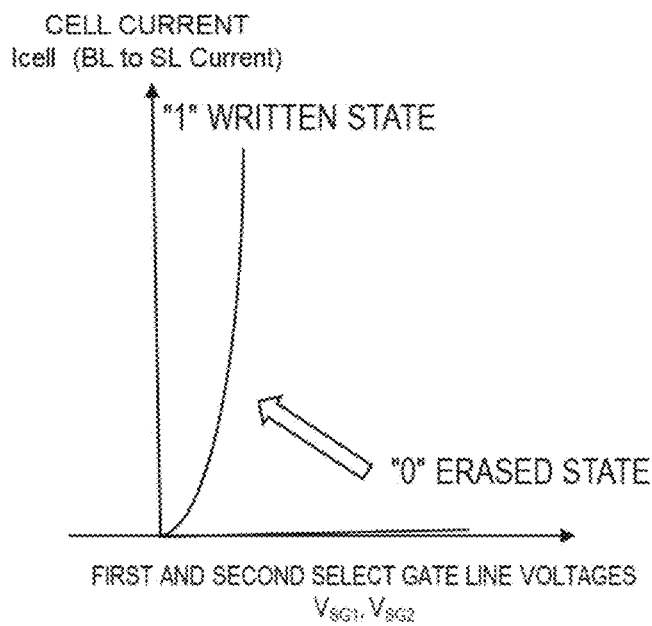

"1" WRITTEN STATE

FIG. 4AB     "0" ERASED STATE

Vb: BUILT-IN VOLTAGE ~0.7V

BL : BIT LINE
SL : SOURCE LINE
SG1 : FIRST SELECT GATE LINE
SG2 : SECOND SELECT GATE LINE
PL : PLATE LINE
FB : FLOATING BODY $$C_{FB} = C_{SG1} + C_{SG2} + C_{PL} + C_{BL} + C_{SL}$$

$$\Delta V_{FB} = V_{FB2} - V_{FB1}$$

$$= \frac{C_{SG1} + C_{SG2}}{C_{SG1} + C_{SG2} + C_{PL} + C_{BL} + C_{SL}} \times V_{ReadSG} \quad (1)$$

"1" WRITTEN STATE
FIG. 5AA  $V_{SG1} = V_{SG2} = V_{PL} = 0V, V_{SL} = V_{BL} = 0V$
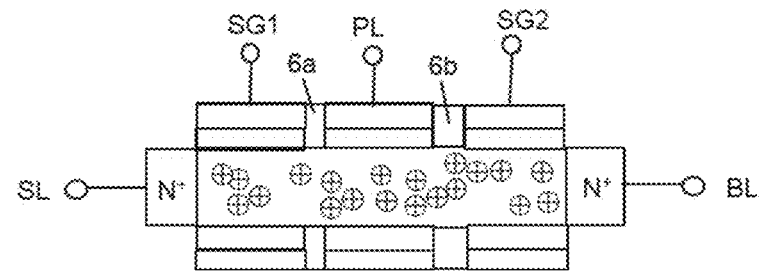
FIG. 5AB  $V_{SG1} = V_{SG2} = 0V, \quad V_{PL} = -0.7V, V_{SL} = V_{BL} = 0V$
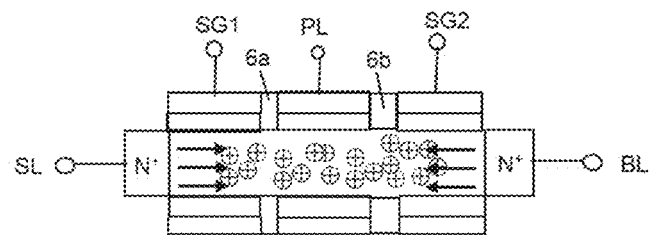

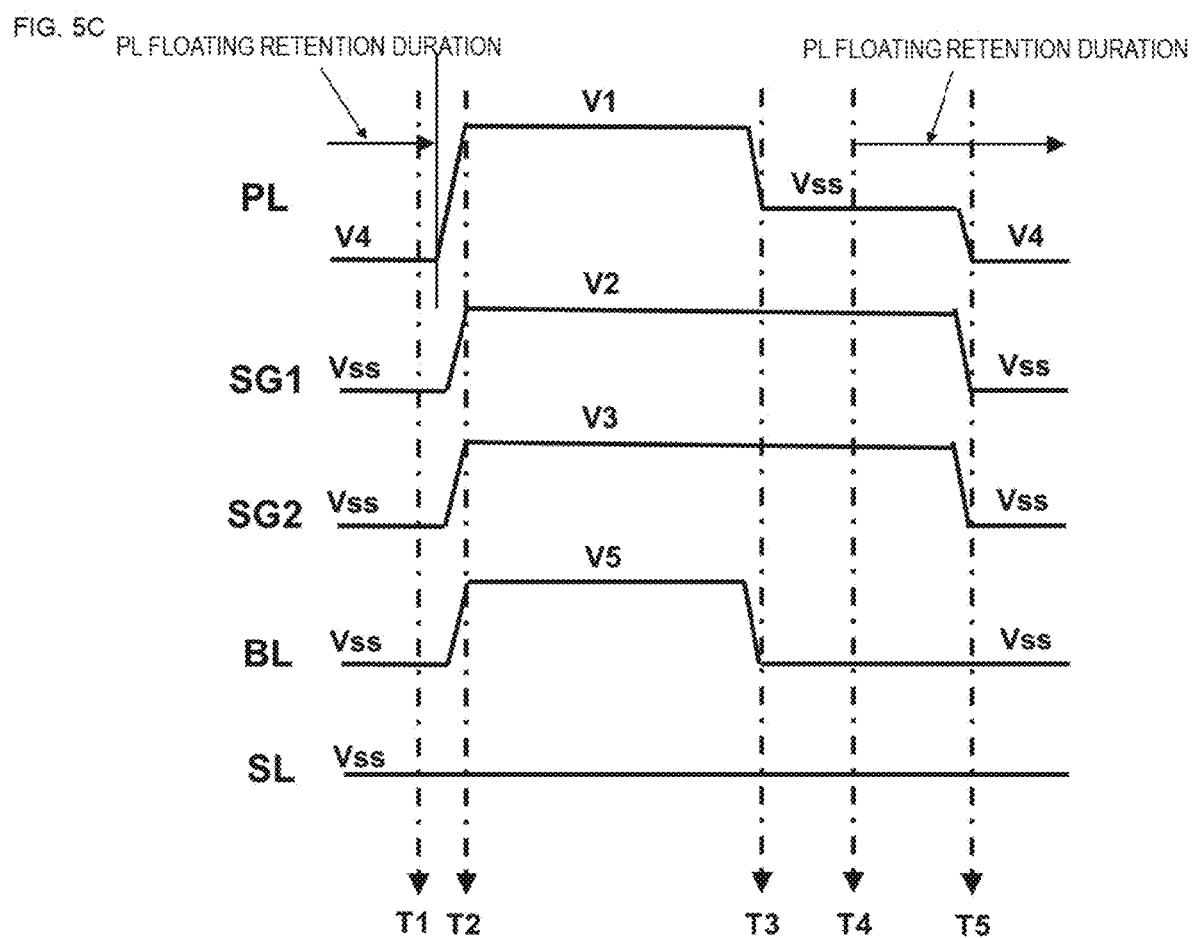

MEMORY DEVICE INCLUDING SEMICONDUCTOR ELEMENT

INCORPORATION BY REFERENCE

This application claims priority to PCT/JP2022/038066, filed Oct. 12, 2022, the entire content of which is incorporated herein by reference.

BACKGROUND OF THE INVENTION

Field of the Invention

The present invention relates to a memory device including a semiconductor element.

Description of the Related Art

Increase of integration density and performance of a memory element has been requested in recent development of large scale integration (LSI) technologies.

Increase in density and performance of a memory element has been advanced. Examples of such memory elements include a dynamic random access memory (DRAM; refer to H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011), for example) in which capacitors are connected by using a surrounding gate transistor (SGT; refer to Japanese Patent Laid-open No. H02-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)) as a select transistor, a phase change memory (PCM; refer to H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No 12, December, pp. 2201-2227 (2010), for example) in which variable resistance elements are connected, a resistive random access memory (RRAM; refer to K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V", IEDM (2007), for example), and a magneto-resistive random access memory (MRAM; refer to W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015), for example) in which the orientation of magnetic spin is changed by current to change resistance.

There are also DRAM memory cells (refer to Japanese Patent Laid-open No. H03-171768, M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010), J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida and T. Tanaka: "A Design of a Capacitorless 1T-DRAM Cell Using Gate-induced Drain-Leakage (GIDL) Current for Low-power and High-speed Embedded Memory", IEEE IEDM pp. 913-916 (2003)) constituted by one MOS transistor without capacitors. For example, among holes and electrons generated in a channel through an impact ionization phenomenon with source-drain current of a N-channel MOS transistor, some or all of the holes are held in the channel to write logical storage data "1". Then, the holes are removed from the channel to write logical storage data "0". In such a memory cell, "1" writing memory cells and "0" writing memory cells randomly exist for a common select word line. When on-voltage is applied to the select word line, voltage of a floating-body channel of any selected memory cell connected to the select word line largely varies due to capacitive coupling between the gate electrode and the channel. The memory cell is required to improve operation margin decrease due to variation in the floating-body channel voltage and improve data retention characteristic decrease due to removal of some of holes as signal electric charge accumulated in the channel.

There are twin-transistor MOS transistor memory elements in which one memory cell is formed in an SOI layer by using two MOS transistors (refer to, for example, US2008/0137394 A1, US2003/0111681 A1, and F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron., Vol. E90-c., No. 4 pp. 765-771 (2007)). In these elements, an N+ layer that divides the floating-body channels of the two MOS transistors and functions as a source or a drain is formed in contact with an insulating layer on a substrate side. The N+ layer electrically separates the floating-body channels of the two MOS transistors. Holes as signal electric charge are accumulated only in the floating-body channel of one of the MOS transistors. The other MOS transistor serves as a switch for reading the signal holes accumulated in the one MOS transistor. Since holes as signal electric charge are accumulated in the channel of one MOS transistor in this memory cell as well, the memory cell is required to improve operation margin decrease or improve data retention characteristic decrease due to removal of some of holes as signal electric charge accumulated in the channel, similarly to the above-described memory cell constituted by one MOS transistor.

As illustrated in FIGS. 7A to 7D, a dynamic flash memory cell 111 is constituted by a MOS transistor without capacitors (refer to Japanese Patent No. 7057032 and K. Sakui, N. Harada, "Dynamic Flash Memory with Dual Gate Surrounding Gate Transistor (SGT)", Proc. IEEE IMW, pp. 72-75 (2021)). As illustrated in FIG. 7A, a floating-body semiconductor base material 102 is positioned on a $SiO_2$ layer 101 of a SOI substrate. An $N^+$ layer 103 connected to a source line SL and an $N^+$ layer 104 connected to a bit line BL are positioned at respective ends of the floating-body semiconductor base material 102. A first gate insulating layer 109a is connected to the $N^+$ layer 103 and covers the floating-body semiconductor base material 102, and a second gate insulating layer 109b is connected to the $N^+$ layer 104 and the first gate insulating layer 109a through a slit insulating film 110 and covers the floating-body semiconductor base material 102. A first gate conductor layer 105a covers the first gate insulating layer 109a and is connected to a plate line PL, and a second gate conductor layer 105b covers the second gate insulating layer 109b and is connected to a word line WL. The slit insulating film 110 is positioned between the first gate conductor layer 105a and the second gate conductor layer 105b. Accordingly, the memory cell 111 as a dynamic flash memory (DFM) is formed. The source line SL may be connected to the N+ layer 104, and the bit line BL may be connected to the N+ layer 103.

As illustrated in FIG. 7A, for example, zero voltage is applied to the N+ layer 103 and positive voltage is applied to the N+ layer 104 so that a first N-channel MOS transistor region provided by the floating-body semiconductor base material 102 covered by the first gate conductor layer 105a is operated as a saturated region, and a second N-channel MOS transistor region provided by the floating-body semiconductor base material 102 covered by the second gate conductor layer 105b is operated as a linear region. As a result, an inversion layer 107b is formed on the entire surface of the second N-channel MOS transistor region without a pinch-off point. The inversion layer 107b formed below the second gate conductor layer 105b connected to the word line WL functions as an effective drain of the first N-channel MOS transistor region. As a result, electric field is maximum in a boundary semiconductor base material between the first N-channel MOS transistor region and the second N-channel MOS transistor region, and an impact ionization phenomenon occurs in this region. As illustrated in FIG. 7B, among electrons and holes generated through the impact ionization phenomenon, the electrons are removed from the floating-body semiconductor base material 102 but some or all of these holes 106 are held in the floating-body semiconductor base material 102. In this manner, memory write operation is performed. This state is allocated as logical storage data "1".

As illustrated in FIG. 7C, for example, positive voltage is applied to the plate line PL, zero voltage is applied to the word line WL and the bit line BL, and negative voltage is applied to the source line SL so that the holes 106 are removed from the floating-body semiconductor base material 102 to perform erase operation. This state is allocated as logical storage data "0". At data reading, voltage applied to the first gate conductor layer 105a connected to the plate line PL is set to be higher than threshold voltage for logical storage data "1" and lower than threshold voltage for logical storage data "0". Accordingly, such a characteristic is obtained that no current flows when voltage of the word line WL is set to be high at reading of logical storage data "0" as illustrated in FIG. 7D. With this characteristic, the operation margin is significantly expanded as compared to the above-described memory cell. In this memory cell, since channels in the first and second N-channel MOS transistor regions with gates that are the first gate conductor layer 105a connected to the plate line PL and the second gate conductor layer 105b connected to the word line WL are connected to each other through the floating-body semiconductor base material 102, voltage variation of the floating-body semiconductor base material 102 when select pulsed voltage is applied to the word line WL is largely suppressed. Accordingly, the problems of the above-described memory cell, such as operation margin decrease or data retention characteristic decrease due to removal of some of holes as signal electric charge accumulated in a channel, are largely improved. Further characteristic improvement will be required for such a memory element in the future.

SUMMARY OF THE INVENTION

In a dynamic flash memory cell, refresh operation for logic data retention of a memory cell is required.

To solve the above-described problem, a memory device including a semiconductor element according to the present invention includes a memory block constituted by a plurality of pages arrayed in a column direction, each page being constituted by a plurality of memory cells arrayed in a row direction on a substrate.

Each of the memory cells included in each of the pages includes
    a semiconductor base material positioned on the substrate and standing in a vertical direction or extending in a horizontal direction with respect to the substrate,
    a first impurity region and a second impurity region positioned at respective ends of the semiconductor base material,
    a gate insulating layer contacting a side surface of the semiconductor base material between the first impurity region and the second impurity region,
    a first gate conductor layer covering part or the entire of the gate insulating layer,
    a second gate conductor layer positioned adjacent to the first gate conductor layer and contacting a side surface of the gate insulating layer, and
    a third gate conductor layer positioned adjacent to the second gate conductor layer and contacting the side surface of the gate insulating layer.

In the memory cell, the first impurity region is connected to a source line, the second impurity region is connected to a bit line, the first gate conductor layer is connected to a first select gate line, the second gate conductor layer is connected to a plate line, and the third gate conductor layer is connected to a second select gate line.

A first inter-wiring capacitance is provided between the first select gate line and the plate line, and a second inter-wiring capacitance is provided between the second select gate line and the plate line.

Page erase operation, page write operation, and page read operation are performed by controlling voltage applied to each of the source line, the bit line, the first select gate line, the plate line, and the second select gate line.

Upon operation end of one or both of the page write operation and the page read operation, the voltage of the plate line is set to be lower than ground voltage through capacitive coupling of the first inter-wiring capacitance between the first select gate line and the plate line, and the second inter-wiring capacitance between the second select gate line and the plate line (first invention).

According to a second invention, in the above-described first invention, upon operation end of one or both of the page write operation and the page read operation, the voltage of the plate line is decreased from first voltage that is positive to the ground voltage at a first time point,
    the voltage of the plate line holds the ground voltage in a floating state at a second time point,
    the first select gate line and the second select gate line are decreased from second voltage that is positive and third voltage that is positive, respectively, to the ground voltage at a third time point, and
    the voltage of the plate line is set to fourth voltage that is negative and lower than the ground voltage through capacitive coupling of the first inter-wiring capacitance and the second inter-wiring capacitance.

According to a third invention, in the above-described first invention, the ground voltage is 0 volt.

According to a fourth invention, in the above-described first invention, the first select gate line, the plate line, and the second select gate line are disposed in parallel to one another in a plan view, and the bit line is disposed in a vertical direction with respect to the first select gate line, the plate line, and the second select gate line in a plan view.

According to a fifth invention, in the above-described first invention, the total capacitance of gate capacitance between the first gate conductor layer and the semiconductor base material and gate capacitance between the third gate conductor layer and the semiconductor base material is smaller than gate capacitance between the second gate conductor layer and the semiconductor base material.

According to a sixth invention, in the above-described first invention, in a plan view, the source line is separated for each of the memory cells arrayed in the column direction and is disposed in parallel to the first select gate line, the plate line, and the second select gate line.

According to a seventh invention, in the above-described first invention, the source line is connected in common to all of the memory cells of the pages adjacent to each other in a plan view.

According to an eighth invention, in the above-described first invention, the semiconductor base material is a P-type semiconductor layer, and the first impurity region and the second impurity region are N-type semiconductor layers.

According to a ninth invention, in the above-described first invention, all of the memory cells connected to at least two pairs of the pages are erased in the page erase operation.

According to a tenth invention, in the above-described first invention, in the page erase operation, the number of holes remaining in the semiconductor base material is decreased by annihilating some of the holes in the semiconductor base material in the memory cells of the pages, and in the page write operation, the number of holes remaining in the semiconductor base material in selected memory cells among the memory cells of the pages is increased through an impact ionization phenomenon or gate induction leakage current.

According to a eleventh invention, in the above-described first invention, in the page write operation, a first N-channel MOS transistor region including the first gate conductor layer, and a third N-channel MOS transistor region including the third gate conductor layer are each operated in a linear region, and a second N-channel MOS transistor region including the second gate conductor layer are operated in a saturated region.

According to a twelfth invention, in the above-described first invention, in the page write operation, a second N-channel MOS transistor region including the second gate conductor layer, and a third N-channel MOS transistor region including the third gate conductor layer are each operated in a linear region, and a first N-channel MOS transistor region including the first gate conductor layer is operated in a saturated region.

According to a thirteenth invention, in the above-described first invention, the impact ionization phenomenon occurs inside the semiconductor base material in one or both of the vicinity of a gap between the second gate conductor layer and the third gate conductor layer and the vicinity of a gap between the first gate conductor layer and the second gate conductor layer, and retains the holes inside the semiconductor base material.

According to a fourteenth invention, in the above-described first invention, voltage equal to or higher than the voltage applied to the plate line is applied to the first select gate line and the second select gate line of each of the memory cells connected to non-selected pages among the pages.

According to a fifteenth invention, in the above-described first invention, the first gate conductor layer, the second gate conductor layer, and the third gate conductor layer are made of the same material.

BRIEF DESCRIPTION OF THE DRAWINGS

FIGS. 2A, 2B and 2C are diagrams for description of an erase operation mechanism of the semiconductor memory device according to the first embodiment;

FIGS. 3A, 3B and 3C are diagrams for description of a write operation mechanism of the semiconductor memory device according to the first embodiment;

FIGS. 5AA and 5AB are diagrams for description of an operation mechanism that sets a plate line PL of a non-selected page to voltage lower than 0 volt in the semiconductor memory device according to the first embodiment;

FIG. 5C is an operation waveform diagram for description of the operation mechanism that sets the plate line PL of a non-selected page to voltage lower than 0 volt in the semiconductor memory device according to the first embodiment;

DETAILED DESCRIPTION OF THE PREFERRED EMBODIMENTS

A memory device (hereinafter referred to as dynamic flash memory) including a semiconductor element according to each embodiment of the present invention will be described below with reference to the accompanying drawings.

First Embodiment

The structure and operation mechanism of a dynamic flash memory cell according to a first embodiment of the present invention will be described below with reference to FIGS. 1 and 2A to 2G. The structure of the dynamic flash memory cell will be described with reference to FIG. 1. An operation mechanism that sets a plate line in a floating state to voltage lower than 0 volt through capacitive coupling of each of first and second select gate lines and the plate line after end of page write operation and page read operation will be described with reference to FIGS. 2A to 2G.

Figure 1:
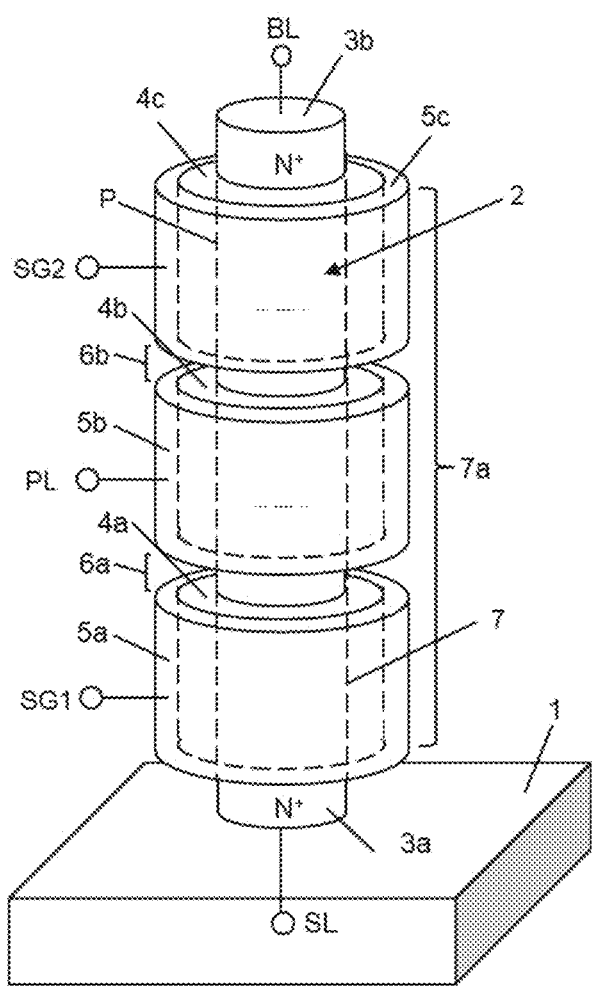
FIG. 1 is a structural diagram of a semiconductor memory device according to a first embodiment.

FIG. 1 illustrates the structure of the dynamic flash memory cell according to the first embodiment of the present invention. A silicon semiconductor pillar 2 (example of "semiconductor pillar" in the claims) (hereinafter, a silicon semiconductor pillar is referred to as an "Si pillar") is disposed on a substrate 1 (example of "substrate" in the claims). The Si pillar 2 is provided with, from the lower side, an N⁺ layer 3a (example of "first impurity region" in the claims), a P layer 7 (hereinafter, a semiconductor region containing acceptor impurities is referred to as a "P layer"), and an N⁺ layer 3b (example of "second impurity region" in the claims). The P layer 7 between the N⁺ layers 3a and 3b is a semiconductor base material 7a. A lower part of the Si pillar 2 is surrounded by, from the lower side, a first gate insulating layer 4a (example of "first gate insulating layer" in the claims), a second gate insulating layer 4b (example of "second gate insulating layer" in the claims), and a third gate insulating layer 4c (example of "third gate insulating layer" in the claims). The first gate insulating layer 4a is surrounded by a first gate conductor layer 5a (example of "first gate conductor layer" in the claims), the second gate insulating layer 4b is surrounded by a second gate conductor layer 5b (example of "second gate conductor layer" in the claims), and the third gate insulating layer 4c is surrounded by a third gate conductor layer 5c (example of "third gate conductor layer" in the claims). The first gate conductor layer 5a and the second gate conductor layer 5b are separated from each other by an insulating layer 6a, and the second gate conductor layer 5b and the third gate conductor layer 5c are separated from each other by an insulating layer 6b. Accordingly, the N⁺ layers 3a and 3b, the P layer 7, the first gate insulating layer 4a, the second gate insulating layer 4b, the third gate insulating layer 4c, the first gate conductor layer 5a, the second gate conductor layer 5b, and the third gate conductor layer 5c form a dynamic flash memory cell. A region of the semiconductor base material 7a between a first N-channel MOS transistor region and a second N-channel MOS transistor region is referred to as a first boundary region, and a region of the semiconductor base material 7a between the second N-channel MOS transistor region and a third N-channel MOS transistor region is referred to as a second boundary region.

As illustrated in FIG. 1, the N⁺ layer 3a is connected to a source line SL (example of "source line" in the claims), the N⁺ layer 3b is connected to a bit line BL (example of "bit line" in the claims), the first gate conductor layer 5a is connected to a first select gate line SG1 (example of "first select gate line" in the claims), the second gate conductor layer 5b is connected to a plate line PL (example of "plate line" in the claims), and the third gate conductor layer 5c is connected to a second select gate line SG2 (example of "second select gate line" in the claims).

It is desirable to have a structure with which the total gate capacitance of the first gate conductor layer 5a connected to the first select gate line SG1 and the second gate conductor layer 5b connected to the plate line PL is larger than the gate capacitance of the third gate conductor layer 5c connected to the second select gate line SG2.

Any or all of the first gate conductor layer 5a, the second gate conductor layer 5b, and the third gate conductor layer 5c may be divided into two or more in a plan view and each operated in or out of synchronization as a conductor electrode of the first select gate line, the plate line, and the second select gate line. With this configuration as well, dynamic flash memory operation is performed.

At least one gate conductor layer connected to the plate line PL may be provided in addition to the second gate conductor layer 5b. Each gate conductor layer may be operated in or out of synchronization as a conductor electrode of the plate line. Dynamic flash memory operation is performed with this configuration as well.

The first gate conductor layer 5a, the second gate conductor layer 5b, and the third gate conductor layer 5c are made of the same material. When made of the same material in this manner, the gate conductor layers can be easily manufactured in terms of processes.

The mechanism of page erase operation (example of "page erase operation" in the claims) will be described below with reference to FIGS. 2A to 2C. The semiconductor base material 7a between the N⁺ layers 3a and 3b is electrically separated from the substrate 1 as a floating body. FIG. 2A illustrates a state in which holes 10 generated through impact ionization in the previous cycle before the page erase operation are stored in the semiconductor base material 7a. As illustrated in FIG. 2B, the voltage of the source line SL is set to a negative voltage V ERA at the page erase operation. The voltage $V_{ERA}$ is, for example, −1.5 V. As a result, the PN junction between the N⁺ layer 3a as a source connected to the source line SL and the semiconductor base material 7a is forward-biased irrespective of the initial potential of the semiconductor base material 7a. As a result, the holes 10 generated through impact ionization in the previous cycle and stored in the semiconductor base material 7a are moved into the N⁺ layer 3a at the source, and potential $V_{FB}$ of the semiconductor base material 7a becomes voltage near $V_{FB}=V_{ERA}+Vb$. In the expression, Vb represents the built-in voltage of the PN junction and is approximately 0.7 V. Accordingly, the potential of the semiconductor base material 7a is −0.8 V in the case of $V_{ERA}=−1.5$ V. This value represents the potential level of the semiconductor base material 7a in an erased state. Thus, the threshold voltage of each N-channel MOS transistor region of the dynamic flash memory cell becomes high due to a substrate bias effect when the potential of the semiconductor base material 7a as a floating body becomes negative voltage. Accordingly, the threshold voltages of the first gate conductor layer 5a connected to the first select gate line SG1, the second gate conductor layer 5b connected to the plate line PL, and the third gate conductor layer 5c connected to the second select gate line SG2 become high. As a result, cell current Icell is zero in a graph with an x axis representing the voltages of the first select gate line SG1 and the second select gate line SG2 as illustrated in FIG. 2C. This erased state of the semiconductor base material 7a represents logical storage data "0". The above-described conditions on voltage applied to each of the bit line BL, the source line SL, the first select gate line SG1, the plate line PL, and the second select gate line SG2 and the potential of the floating body are examples for performing the page erase operation and may be other operation conditions under which the page erase operation can be performed.

FIGS. 3A to 3C illustrate the page write operation (example of "page write operation" in the claims) of the dynamic flash memory cell. As illustrated in FIG. 3A, for example, 0 V is input to the N⁺ layer 3a connected to the source line SL, for example, 1.2 V is input to the N⁺ layer 3b connected to the bit line BL, for example, 2 V is input to the first gate conductor layer 5a connected to the first select gate line SG1 and the third gate conductor layer 5c connected to the second select gate line SG2, and for example, 1.5 V is input to the second gate conductor layer 5b connected to the plate line PL. As a result, as illustrated in FIG. 3A, annular inversion layers 12a and 12c are formed in the semiconductor base material 7a on the inner side of the first gate conductor layer 5a connected to the first select gate line SG1 and on the inner side of the third gate conductor layer 5c connected to the second select gate line SG2. As a result, the first N-channel MOS transistor region including the first gate conductor layer 5a and the third N-channel MOS transistor region including the third gate conductor layer 5c are each operated in, for example, a linear region. The second N-channel MOS transistor region including the second gate conductor layer 5b connected to the plate line PL is operated in, for example, a saturated region. As a result, a pinch-off point P exists in an inversion layer 12b. In this case, the inversion layers 12a and 12c, which are formed at the entire surfaces on the inner side of the first gate conductor layer 5a connected to the first select gate line SG1 and on the inner side of the third gate conductor layer 5c connected to the second select gate line SG2, function as the effective source and drain, respectively, of the second N-channel MOS transistor region including the second gate conductor layer 5b connected to the plate line PL.

As a result, electric field is maximum in the second boundary region of the semiconductor base material 7a between the second N-channel MOS transistor region and the third N-channel MOS transistor region connected in series, and an impact ionization phenomenon occurs in this region. The region is a region on the source side when viewed from the third N-channel MOS transistor region including the third gate conductor layer 5c connected to the second select gate line SG2, and thus, this phenomenon is referred to as a source-side impact ionization phenomenon. Through the source-side impact ionization phenomenon, electrons flow from the N$^+$ layer 3a connected to the source line SL toward the N$^+$ layer 3b connected to the bit line BL. Such accelerated electrons collide with lattice Si atoms, and pairs of electrons and holes are generated by their kinetic energy. Some of the generated electrons flow to the first gate conductor layer 5a, the second gate conductor layer 5b, and the third gate conductor layer 5c, but most of the generated electrons flow to the N$^+$ layer 3b connected to the bit line BL. In "1" writing, pairs of electrons and holes may be generated by using gate induced drain leakage (GIDL) current, and a floating body FB may be filled with the generated holes (refer to E. Yoshida and T. Tanaka: "A Design of a Capacitorless 1T-DRAM Cell Using Gate-induced Drain Leakage (GIDL) Current for Low-power and High-speed Embedded Memory", IEEE IEDM, pp. 913-916 (2003), for example).

Then, as illustrated in FIG. 3B, the generated holes 10 are majority carriers in the semiconductor base material 7a and charge the semiconductor base material 7a in positive bias. Since the N$^+$ layer 3a connected to the source line SL is 0 V, the semiconductor base material 7a is charged to the vicinity of the built-in voltage Vb (approximately 0.7 V) of the PN junction between the N$^+$ layer 3a connected to the source line SL and the semiconductor base material 7a. As the semiconductor base material 7a is charged in positive bias, the threshold voltages of the first N-channel MOS transistor region, the second N-channel MOS transistor region, and the third N-channel MOS transistor region decrease due to a substrate bias effect. Accordingly, as illustrated in FIG. 3C, the cell current Icell on a y axis in a graph with an x axis representing the voltages of the first select gate line SG1 and the second select gate line SG2 flows. This written state of the semiconductor base material 7a is allocated as logical storage data "1".

In the page write operation, pairs of electrons and holes may be generated through an impact ionization phenomenon or GIDL current in the first boundary region of the semiconductor base material 7a between the first N-channel MOS transistor region and the second N-channel MOS transistor region in place of the above-described second boundary region, and the semiconductor base material 7a may be charged with the generated holes 10. Alternatively, pairs of electrons and holes may be generated through an impact ionization phenomenon or GIDL current in a boundary region between the N$^+$ layer 3a and the semiconductor base material 7a or a boundary region between the N$^+$ layer 3b and the semiconductor base material 7a, and the semiconductor base material 7a may be charged with the generated holes 10. The above-described conditions on voltage applied to each of the bit line BL, the source line SL, the first select gate line SG1, the plate line PL, the second select gate line SG2 are examples for performing the page write operation and may be other voltage conditions under which the page write operation can be performed.

Figure 4A:
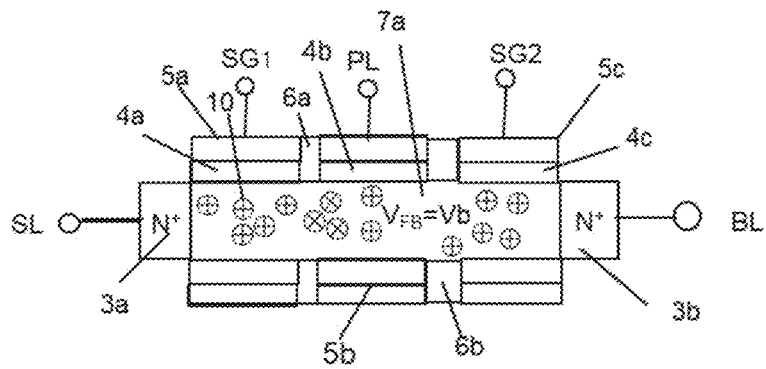
FIGS. 4AA, 4AB and 4AC are diagrams for description of a read operation mechanism of the semiconductor memory device according to the first embodiment.
Figure 4A:
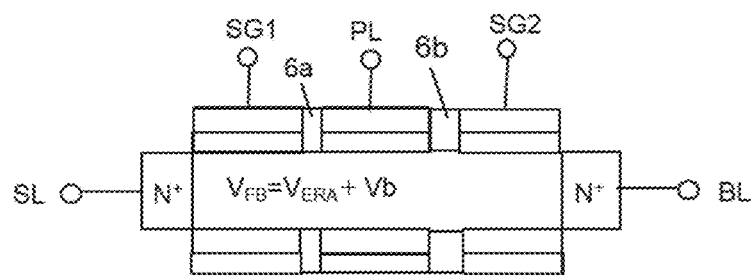
Figure 4A:
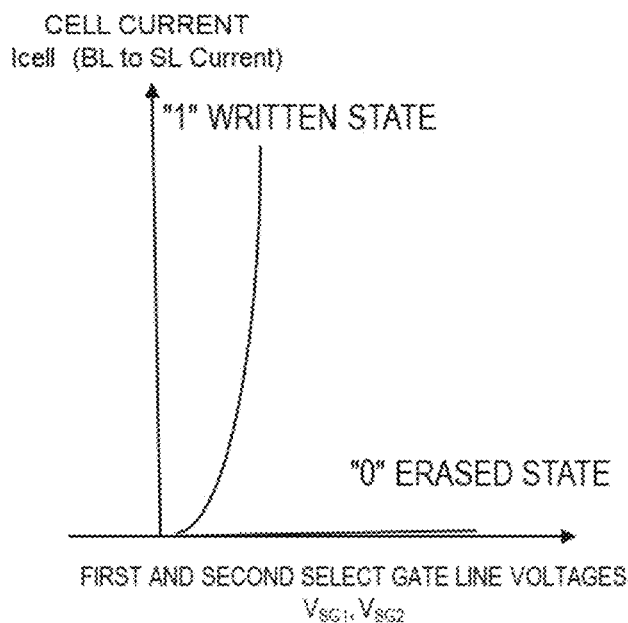

The page read operation (example of "page read operation" in the claims) of the dynamic flash memory cell will be described below with reference to FIGS. 4AA to 4AC and 4BA to 4BC. The page read operation of the dynamic flash memory cell will be described with reference to FIGS. 4AA to 4AC. As illustrated in FIG. 4AA, when the semiconductor base material 7a is charged to the built-in voltage Vb (approximately 0.7 V), threshold voltage decreases due to a substrate bias effect. This state is allocated as logical storage data "1". As illustrated in FIG. 4AB, the floating voltage $V_{FB}$ of the semiconductor base material 7a is V ERA+Vb when a memory block selected before writing is performed is in the erased state "0" in advance. The written state "1" is stored in a randomly selected cell through the write operation. As a result, logical storage data of "0" and "1" is produced for the first and second select gate lines SG1 and SG2. As illustrated in FIG. 4AC, reading is performed by a sense amplifier by using the magnitude difference between two threshold voltages for the first and second select gate lines SG1 and SG2.

Figure 4B:
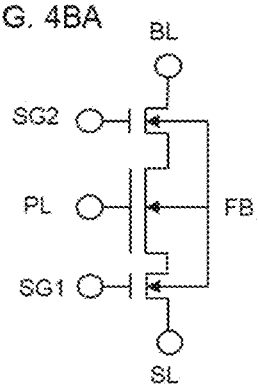
FIGS. 4BA, 4BB and 4BC are diagrams for description of the gate capacitance magnitude relation among first, second, third gate conductor layers and related operation in the semiconductor memory device according to the first embodiment in read operation.
Figure 4B:
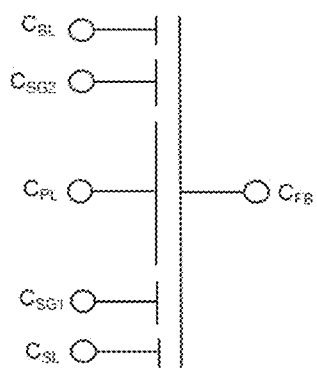
Figure 4B:
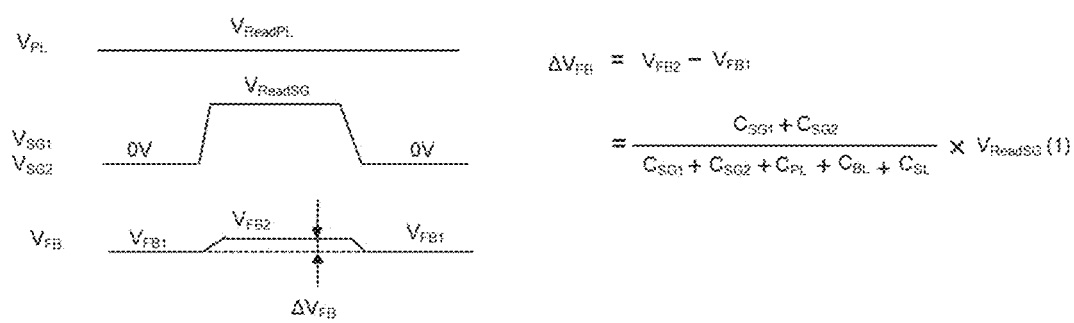

The gate capacitance magnitude relation among the first gate conductor layer 5a, the second gate conductor layer 5b, the third gate conductor layer 5c and related operation in the dynamic flash memory cell in the page read operation will be described below with reference to FIGS. 4BA to 4BC. The gate capacitance of the second gate conductor layer 5b is desirably designed to be larger than the total gate capacitance of the first gate conductor layer 5a and the third gate conductor layer 5c. As illustrated in FIG. 4BA, the total length of the first gate conductor layer 5a and the third gate conductor layer 5c in the vertical direction is set to be shorter than the length of the second gate conductor layer 5b connected to the plate line PL in the vertical direction, and the gate capacitance of the second gate conductor layer 5b connected to the plate line PL is set to be larger than the total gate capacitance of the first gate conductor layer 5a and the third gate conductor layer 5c connected to the first select gate line SG1 and the second select gate line SG2, respectively. FIG. 4BB illustrates an equivalent circuit of one cell of the dynamic flash memory.

FIG. 4BC illustrates the coupling capacitance relation of the dynamic flash memory. In the drawing, $C_{SG1}$ represents the capacitance of the first gate conductor layer 5a, $C_{PL}$ represents the capacitance of the second gate conductor layer 5b, $C_{SG2}$ represents the capacitance of the third gate conductor layer 5c, $C_{BL}$ represents the capacitance of the PN junction between the N$^+$ layer 3b as a drain and the semiconductor base material 7a, and $C_{SL}$ represents the capacitance of the PN junction between the N$^+$ layer 3a as a source and the semiconductor base material 7a. As illustrated in FIG. 4BC, as the voltages of the first select gate line SG1 and the second select gate line SG2 oscillate, this behavior affects as noise on the semiconductor base material 7a. Variation $\Delta V_{FB}$ of the potential of the semiconductor base material 7a in this case is given by:

$$\Delta V_{FB} = (C_{SG1} + C_{SG2})/(C_{SG1} + C_{SG2} + C_{PL} + C_{BL} + C_{SL}) \times V_{ReadSG} \quad (1)$$

In the expression, $V_{ReadSG}$ represents oscillation potential of the first select gate line SG1 and the second select gate line SG2 in reading. As understood from Expression (1), $\Delta V_{FB}$ decreases as the contribution ratio of $(C_{SG1} + C_{SG2})$ relative to the total capacitance $(C_{SG1} + C_{SG2} + C_{PL} + C_{BL} + C_{SL})$ of the semiconductor base material 7a is reduced. It is possible to further decrease $\Delta V_{FB}$, without decreasing the scale of integration of the memory cell in a plan view, by further shortening the length of the first and third gate conductor layers 5a and 5c in the vertical direction, which are connected to the first select gate line SG1 and the second select gate line SG2, respectively, as compared to the length of the second gate conductor layer 5b in the vertical direction, which is connected to the plate line PL. The above-described conditions on voltage applied to each of the bit line BL, the source line SL, the plate line PL, the first select gate line SG1, the second select gate line SG2 and the potential of the floating body are examples for performing the read operation and may be other operation conditions under which the read operation can be performed.

Operation that sets the plate line PL of a non-selected page to voltage lower than 0 volt in the dynamic flash memory cell will be described below with reference to FIGS. 5AA to 5B. FIG. 5AA illustrates a case in which voltages $V_{SG1}$, $V_{SG2}$, and $V_{PL}$ applied to the first select gate line SG1, the second select gate line SG2, and the plate line PL, respectively, are set to the same voltage of, for example, 0 V after "1" writing. In this case, the holes 10 stored in the semiconductor base material 7a spread across the entire semiconductor base material 7a. FIG. 5AB illustrates a case in which the voltages $V_{SG1}$ and $V_{SG2}$ applied to the first select gate line SG1 and the second select gate line SG2, respectively, are set to 0 V and the voltage $V_{PL}$ applied to the plate line PL is set to −0.7 V after "1" writing. In this case, the stored holes 10 concentrate at the semiconductor base material 7a surrounded by the second gate conductor layer 5b connected to the plate line PL. This is because the holes 10 having positive electric charge are more attracted to the semiconductor base material 7a surrounded by the second gate conductor layer 5b connected to the plate line PL to which the negative voltage of −0.7 V is applied than to the first gate conductor layer 5a and the third gate conductor layer 5c connected to the first select gate line SG1 and the second select gate line SG2 to which 0 V is applied. As a result, the holes 10 are shielded from the PN junction between the N⁺ layer 3a as a source and the semiconductor base material 7a and the PN junction between the N⁺ layer 3b as a drain and the semiconductor base material 7a. Accordingly, recombination of holes and electrons at the PN junction between the N⁺ layer 3a as a source and the semiconductor base material 7a and the PN junction between the N⁺ layer 3b as a drain and the semiconductor base material 7a is prevented. Moreover, no inversion layer exist in regions in which the first gate conductor layer 5a, the second gate conductor layer 5b, and the third gate conductor layer 5c surround the semiconductor base material 7a, and recombination of holes and electrons in such an inversion layer completely does not occur. Accordingly, the holes 10 stored in the semiconductor base material 7a can be retained for a long time.

Figure 5B:
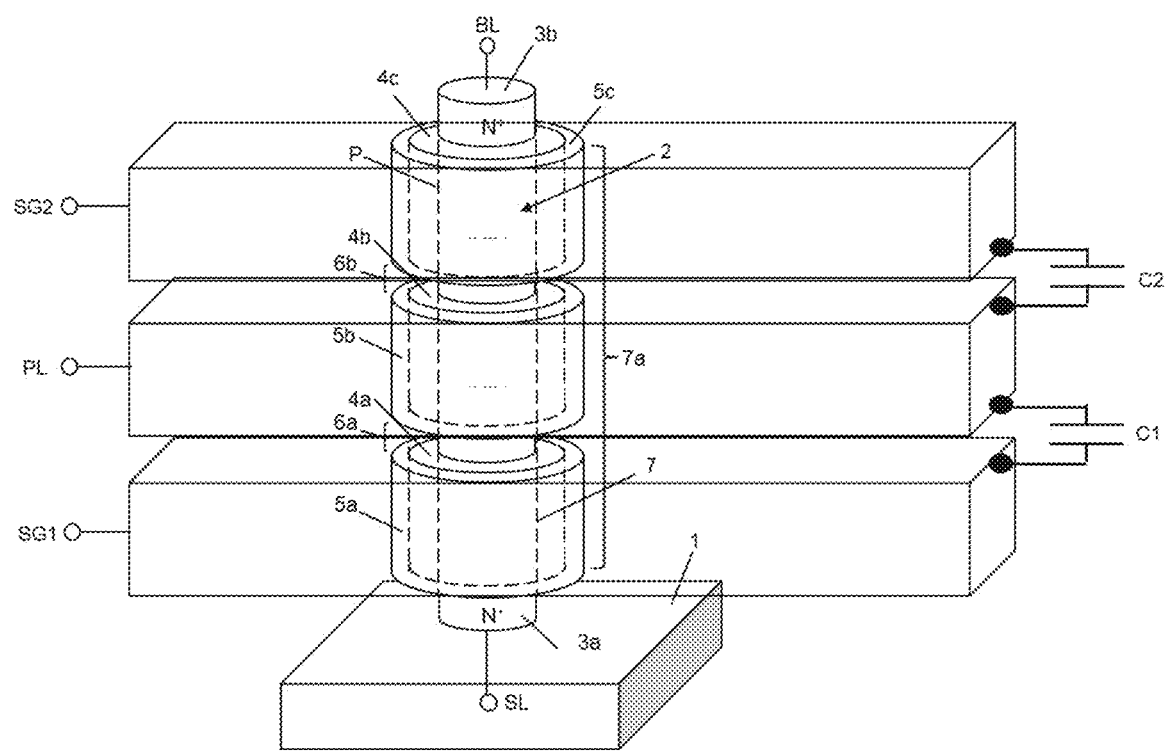
FIG. 5B is a structural diagram for description of a first inter-wiring capacitance C1 between a first select gate line SG1 and the plate line PL and a second inter-wiring capacitance C2 between a second select gate line SG2 and the plate line PL in the semiconductor memory device according to the first embodiment.

FIG. 5B illustrates the structure of the dynamic flash memory cell in FIG. 1 to which a first inter-wiring capacitance C1 (example of "first inter-wiring capacitance" in the claims) between the first select gate line SG1 and the plate line PL and a second inter-wiring capacitance C2 (example of "second inter-wiring capacitance" in the claims) between the second select gate line SG2 and the plate line PL are added. The first select gate line SG1 and the second select gate line SG2 are disposed in parallel to each other with the plate line PL sandwiched therebetween and thus occupy most of the inter-wiring capacitance of the plate line PL. Accordingly, capacitive coupling of the plate line PL effectively functions with the first inter-wiring capacitance C1 between the first select gate line SG1 and the plate line PL and with the second inter-wiring capacitance C2 between the second select gate line SG2 and the plate line PL.

FIG. 5C illustrates the mechanism of operation that sets the voltage of the plate line PL to negative voltage lower than ground voltage Vss (example of "ground voltage" in the claims) at operation end of the page write operation and the page read operation. The ground voltage Vss is, for example, 0 volt. In FIG. 5C, the voltage of the plate line PL is, for example, fourth voltage V4 (example of "fourth voltage" in the claims) at a time point T1 before start of the page write operation or the page read operation. The fourth voltage V4 is, for example, −0.7 V. In a case in which operation before the time point T1 is the page erase operation, the voltage of the plate line PL is, for example, the ground voltage Vss. However, every memory cell connected to the plate line PL is in the "0" erased state, and retention characteristics of the holes 10 that retain the "1" written state cause no problem for the semiconductor base material 7a. At the time point T1, the first select gate line SG1, the second select gate line SG2, the bit line BL, and the source line SL are at the ground voltage Vss, for example.

At a time point T2 in FIG. 5C, the page write operation or the page read operation is started. The voltage of the plate line PL becomes first voltage V1 (example of "first voltage" in the claims), the voltage of the first select gate line SG1 becomes second voltage V2 (example of "second voltage" in the claims), the voltage of the second select gate line SG2 becomes third voltage V3 (example of "third voltage" in the claims), and the voltage of the bit line BL becomes fifth voltage V5 (example of "fifth voltage" in the claims). The source line SL maintains, for example, the ground voltage Vss. In a case of the page write operation, the first voltage V1, the second voltage V2, the third voltage V3, and the fifth voltage V5 are, for example, 1.5 V, 2.0 V, 2.0 V, and 0.8 V, respectively. In a case of the page read operation, the first voltage V1, the second voltage V2, the third voltage V3, and the fifth voltage V5 are, for example, 0.8 V, 1.5 V, 1.5 V, and 0.2 V, respectively.

At a time point T3 as a first time point (example of "first time point" in the claims) in FIG. 5C, the voltage of the plate line PL decreases from the first voltage V1 to the ground voltage Vss. In addition, the voltage of the bit line BL is decreased from the fifth voltage V5 to the ground voltage Vss at the time point T3. At a time point T4 as a second time point (example of "second time point" in the claims), the voltage of the plate line PL retains the ground voltage Vss. Then, an MOS transistor that drives the plate line PL in a row decoder circuit is set to non-conduction (not illustrated). Accordingly, the plate line PL becomes a floating state (example of "floating state" in the claims).

At a time point T5 as a third time point (example of "third time point" in the claims) in FIG. 5C, the voltages of the first select gate line SG1 and the second select gate line SG2 are decreased from the second voltage V2 and the third voltage V3, respectively, to the ground voltage Vss. As a result, capacitive coupling of the plate line PL with the first inter-wiring capacitance C1 between the first select gate line SG1 and the plate line PL and with the second inter-wiring capacitance C2 between the second select gate line SG2 and the plate line PL functions as illustrated in FIG. 5B. The ratios of capacitive coupling of the first inter-wiring capacitance C1 and the second inter-wiring capacitance C2 with the plate line PL are, for example, 0.4. In other words, the first inter-wiring capacitance C1 and the second inter-wiring capacitance C2 occupy 80% of the total wiring capacitance of the plate line PL in this case. Accordingly, in a case in which the second voltage V2 and the third voltage V3 are, for example, 2.0 V, capacitive coupling of 2.0 V×(0.4+0.4) =1.6 V functions and the voltage of the plate line PL changes from the floating state at 0 V to the floating state at −1.6 V as the voltages of the first select gate line SG1 and the second select gate line SG2 decrease to 0 V. However, the voltage of the plate line PL stays at the fourth voltage of, for example, −0.7 V and does not become equal to or lower than −0.7 V because the built-in voltage of the pn junction between a source region of the MOS transistor that drives the plate line PL in the row decoder circuit and the substrate is approximately 0.7 V. However, since the voltage of the plate line PL becomes −0.7 V in non-selection operation, the holes 10 for retaining the "1" written state concentrate at a central part of the semiconductor base material 7a surrounded by the plate line PL and do not approach the pn junction between the semiconductor base material 7a and each of the source line SL and the bit line BL at respective ends of the semiconductor base material 7a as illustrated in FIG. 5AB. As a result, recombination of the holes 10 and electrons is significantly reduced in these pn junction regions, and the holes 10 stored in the semiconductor base material 7a can be retained for a long time.

Figure 5D:
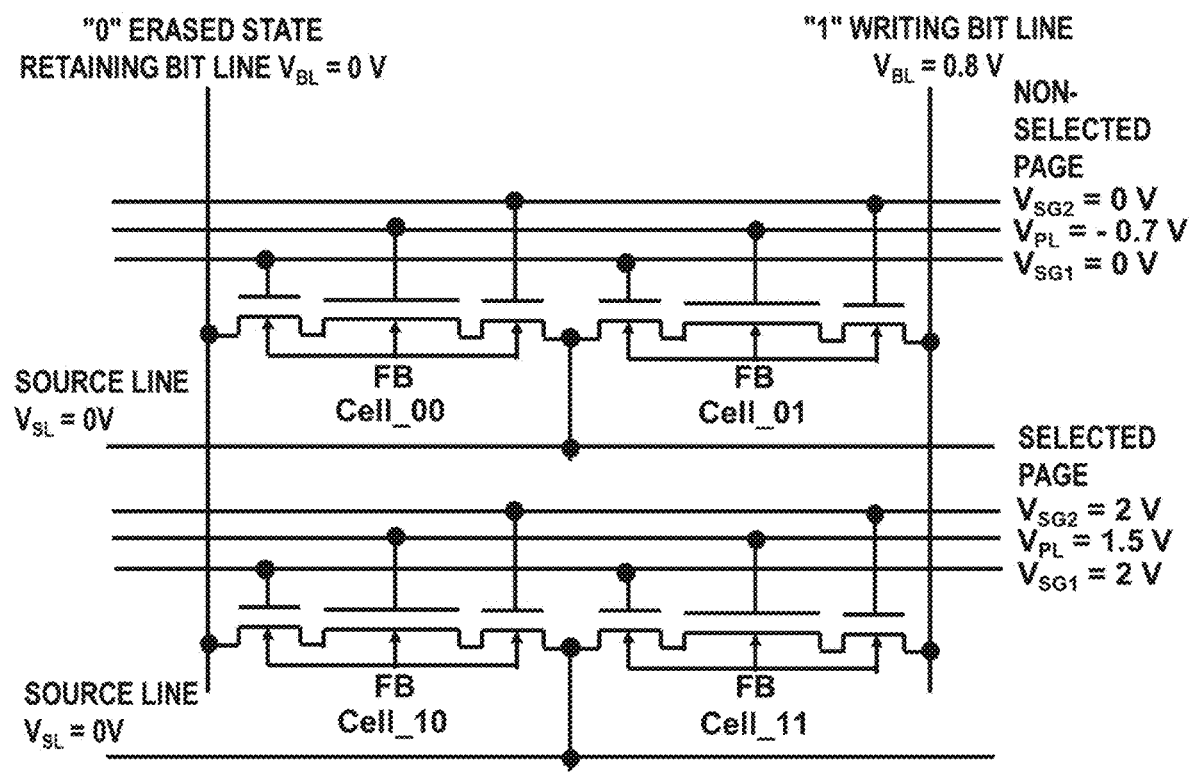
FIG. 5D is a diagram of a 2×2 memory array in which the plate line PL of a non-selected page is set to voltage lower than 0 volt in the semiconductor memory device according to the first embodiment.

The page write operation when negative voltage is applied to the plate line PL of a non-selected page will be described below with reference to FIG. 5D. In a selected page, for example, $V_{BL}$=0 V is applied to the bit line BL of a memory cell Cell_10 maintaining "0" erased data. For example, $V_{BL}$=0.8 V is applied to the bit line BL of a memory cell Cell_11 to which "1" data is written. In addition, for example, $V_{SG1}$=2.0 V and $V_{SG2}$=2.0 V are applied to the first select gate line SG1 and the second select gate line SG2, respectively, of the selected page, and for example, $V_{PL}$=1.5 V is applied to the plate line PL. As a result, an impact ionization phenomenon occurs in the semiconductor base material 7a of the memory cell Cell_11, the semiconductor base material 7a is filled with the holes 10 thus generated, and accordingly, "1" writing of the memory cell Cell_11 is performed. The voltage $V_{BL}$=0.8 V of the bit line BL for "1" writing is also applied to a memory cell Cell_01 of the non-selected page since the bit line BL is common. In addition, for example, $V_{PL}$=−0.7 V is applied as the voltage of the plate line PL in the memory cell Cell_01 of the non-selected page. However, since the second select gate line SG2 of the non-selected page is positioned between the bit line BL and the plate line PL and voltage applied thereto is $V_{SG2}$=0 V, electric field between the bit line BL and the plate line PL of the memory cell Cell_01 is completely shielded by the second select gate line SG2. As a result, GIDL current occurs in the memory cell of the non-selected page, disturbance that storage data in the memory cell is wrongly written does not occur, and thus the memory device can achieve extremely high reliability.

Figure 6:
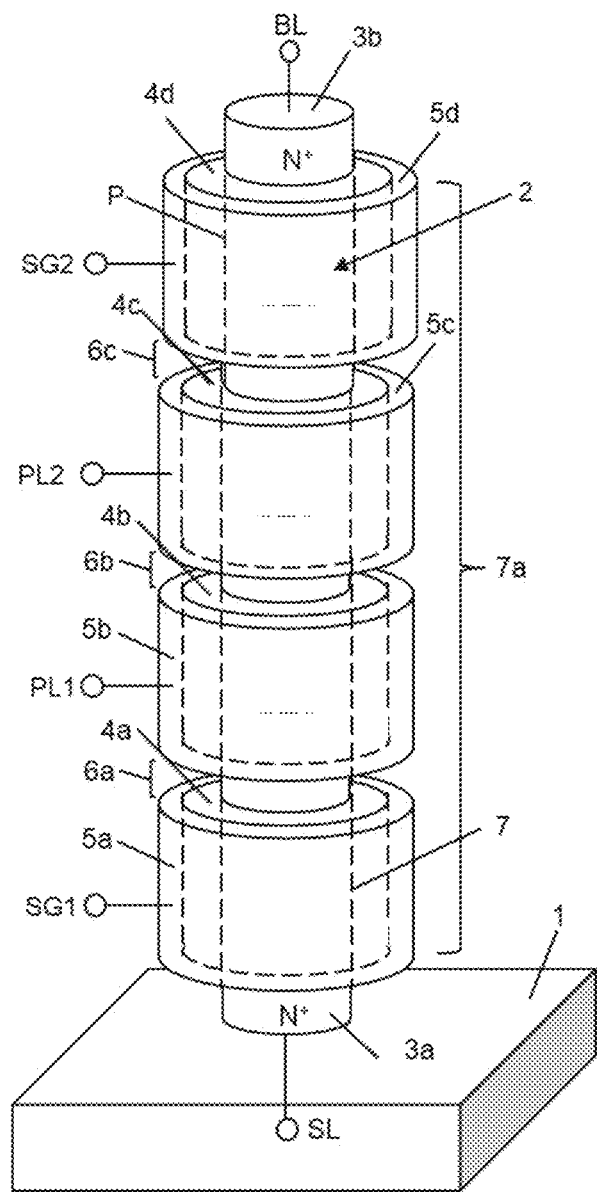
FIG. 6 is a structural diagram of the semiconductor memory device according to the first embodiment.
Figure 7A:
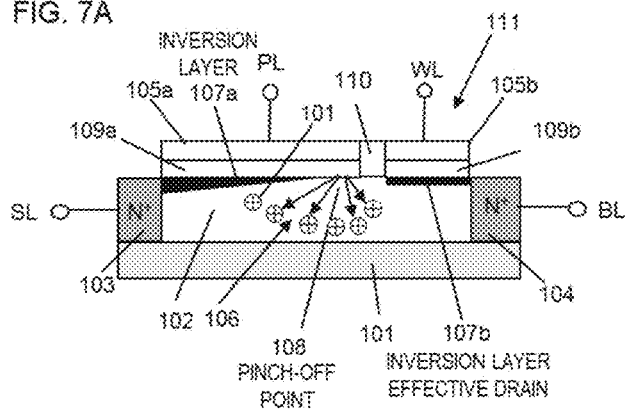
FIGS. 7A, 7B, 7C and 7D are diagrams for description of a dynamic flash memory of a conventional example.
Figure 7B:
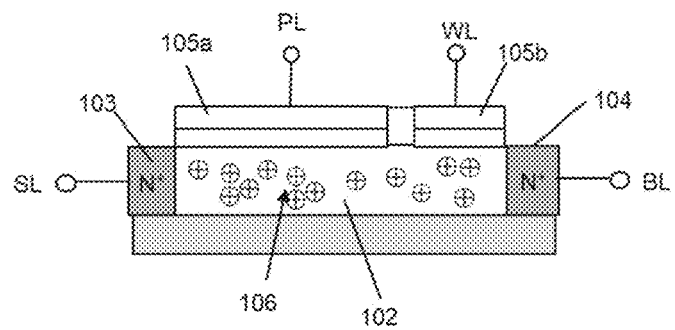
Figure 7C:
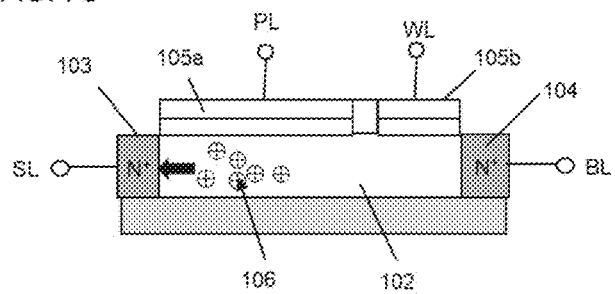
Figure 7D:
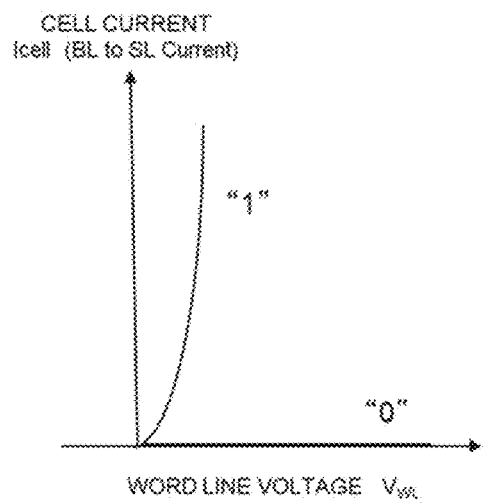

FIG. 6 illustrates a structural diagram in which the plate line PL is constituted by at least two plate lines PL1 and PL2. The dynamic flash memory operation described above in the present embodiment can be performed with such a structure as well. The silicon semiconductor pillar 2 (hereinafter, a silicon semiconductor pillar is referred to as an "Si pillar") is disposed on the substrate 1. The Si pillar 2 is provided with, from the lower side, the N⁺ layer 3a, the P layer 7, and the N⁺ layer 3b. The P layer 7 between the N⁺ layers 3a and 3b is the semiconductor base material 7a. The lower part of the Si pillar 2 is surrounded by, from the lower side, the first gate insulating layer 4a, the second gate insulating layer 4b, the third gate insulating layer 4c, and a fourth gate insulating layer 4d. The first gate insulating layer 4a is surrounded by the first gate conductor layer 5a, the second gate insulating layer 4b is surrounded by the second gate conductor layer 5b, the third gate insulating layer 4c is surrounded by the third gate conductor layer 5c, and the fourth gate insulating layer 4d is surrounded by a fourth gate conductor layer 5d. The first gate conductor layer 5a and the second gate conductor layer 5b are separated from each other by the insulating layer 6a, the second gate conductor layer 5b and the third gate conductor layer 5c are separated from each other by the insulating layer 6b, and the third gate conductor layer 5c and the fourth gate conductor layer 5d are separated from each other by an insulating layer 6c. Accordingly, the N⁺ layers 3a and 3b, the P layer 7, the first gate insulating layer 4a, the second gate insulating layer 4b, the third gate insulating layer 4c, the fourth gate insulating layer 4d, the first gate conductor layer 5a, the second gate conductor layer 5b, the third gate conductor layer 5c, and the fourth gate conductor layer 5d form a dynamic flash memory cell. As illustrated in FIG. 6, the N⁺ layer 3a is connected to the source line SL, the N⁺ layer 3b is connected to the bit line BL, the first gate conductor layer 5a is connected to the first select gate line SG1, the second gate conductor layer 5b is connected to the first plate line PL1, the third gate conductor layer 5c is connected to the second plate line PL2, and the fourth gate conductor layer 5d is connected to the second select gate line SG2.

The dynamic flash memory operation described above in the present embodiment can be performed even when the horizontal sectional shape of the Si pillar 2 in FIG. 1 is circular, elliptical, or rectangular. Circular, elliptical, and rectangular dynamic flash memory cells may be provided in mixture on the same chip.

With reference to FIG. 1, a dynamic flash memory element is described above with an example of an SGT including the first gate insulating layer 4a, the second gate insulating layer 4b, and the third gate insulating layer 4c, which entirely surround the side surface of the Si pillar 2 vertically standing on the substrate, and the first gate conductor layer 5a, the second gate conductor layer 5b, and the third gate conductor layer 5c, which entirely surround the first gate insulating layer 4a, the second gate insulating layer 4b, the third gate insulating layer 4c. As described above in the present embodiment, the dynamic flash memory element only needs to have a structure satisfying a condition that the holes 10 generated through an impact ionization phenomenon are retained in the semiconductor base material 7a. For this purpose, the semiconductor base material 7a only needs to have a floating body structure separated from the substrate 1. Accordingly, even when the semiconductor base material is horizontally formed with respect to the substrate 1, the above-described dynamic flash memory operation can be performed by using, for example, a gate-all-around (GAA: refer to J. Y. Song, W. Y. Choi, J. H. Park, J. D. Lee, and B-G. Park: "Design Optimization of Gate-All-Around (GAA) MOSFETs", IEEE Trans. Electron Devices, vol. 5, no. 3, pp. 186-191, (2006), for example) technology or a nanosheet technology (refer to N. Loubet, et al.: "Stacked Nanosheet Gate-All-Around Transistor to Enable Scaling Beyond Fin-FET", 2017 IEEE Symposium on VLSI Technology Digest of Technical Papers, T17-5, T230-T231, (2017), for example) as an SGT. Alternatively, a device structure (refer to J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida and T. Tanaka: "A Design of a Capacitorless 1T-DRAM Cell Using Gate-induced Drain Leakage (GIDL) Current for Low-power and High-speed Embedded Memory", IEEE IEDM, pp. 913-916 (2003), for example) using a silicon-on-insulator (SOI) is also applicable. In the device structure, a bottom part of a semiconductor base material contacts an insulating layer of an SOI substrate, and another semiconductor base material is surrounded by a gate insulating layer and an element separation insulating layer. In this structure as well, each semiconductor base material has a floating body structure. Thus, the dynamic flash memory element provided by the present embodiment only needs to satisfy a condition that each semiconductor base material has a floating body structure. With a structure in which a fin transistor (refer to H. Jiang, N. Xu, B. Chen, L. Zengl, Y. He, G. Du, X. Liu and X. Zhang: "Experimental investigation of self heating effect (SHE) in multiple-fin SOI FinFETs", Semicond. Sci. Technol. 29 115021 pp. 7 (2014), for example) is formed on an SOI substrate, as well, the dynamic flash memory operation can be performed when a semiconductor base material has a floating body structure.

Reset voltages of the above-described first and second select gate lines SG1 and SG2, the bit line BL, and the source line SL are described above as Vss but may be different from one another.

The meaning of "cover" in the description of "a gate insulating layer, a gate conductor layer, or the like covers a channel or the like" in the present specification and the claims includes a case of entirely surrounding as in an SGT and a GAA, a case of partially surrounding as in a fin transistor, and a case of overlapping on a plane as in a planar transistor.

In FIG. 1, the first gate conductor layer 5a entirely surrounds the first gate insulating layer 4a. However, the first gate conductor layer 5a may partially surround the first gate insulating layer 4a in a plan view. The first gate conductor layer 5a may be divided into at least two gate conductor layers and operated as gate electrodes of at least two plate lines PL. The gate electrodes of the plate lines PL may be stacked in multiple layers as illustrated in FIG. 6 or separated to right and left parts corresponding to the halves of 360°. Similarly, the second gate conductor layer 5b may be divided into two parts or more, and the parts may be operated in or out of synchronization as gate conductor electrodes. Accordingly, the dynamic flash memory operation can be performed. In a case in which the first gate conductor layer 5a is divided into two parts or more, at least one of the divided parts of the first gate conductor layers functions as the above-described first gate conductor layer 5a. In a case in which the second gate conductor layer 5b is divided, as well, at least one of the divided parts of the second gate conductor layer functions as the above-described second gate conductor layer 5b.

The above-described condition on voltage applied to each of the bit line BL, the source line SL, the first and second select gate lines SG1 and SG2, and the plate line PL and the voltage of the floating body are examples for performing basic operations of erase operation, write operation, and read operation and may be any other voltage conditions as long as the basic operations of the present invention can be performed.

The present embodiment has the following characteristics.

Characteristic 1

The dynamic flash memory cell according to the first embodiment of the present invention has a characteristic that the plate line PL of a non-selected page in a floating state is set to negative voltage lower than 0 volt by using capacitive coupling of each of the first and second select gate lines SG1 and SG2 and the plate line PL. Accordingly, all plate lines PL in non-selected states are set to negative voltage of, for example, −0.7 V. As a result, the holes 10 stored in the semiconductor base material 7a of each memory cell in a non-selected page can exist mainly on the plate line PL side. Accordingly, recombination of holes and electrons at the PN junction between the bit line BL and the semiconductor base material 7a and the PN junction between the source line SL and the semiconductor base material 7a is reduced. Moreover, no inversion layer is formed in the semiconductor base material 7a since negative voltage is applied to the plate line PL. Accordingly, decrease of the number of holes 10 as a signal is prevented. As a result, "1" writing retention characteristics of the holes 10 accumulated in the semiconductor base material 7a are significantly improved.

T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp 1510-1522 (2002) and Non T. Ohsawa, "SOI DRAM with One-Transistor FET Cell", Oyo Buturi, vol. 75, No. 9, pp 1131-1135, (2006) disclose methods of extending "1" writing retention characteristics by setting a non-selected word line WL to −1.5 V. However, 1.8 V is applied to the bit line BL at writing, and thus voltage of 3.3 V is applied between the gate and the drain. It is disclosed that in this case, corruption of "0" storage data occurs with gate induced drain leakage current (GIDL current) in a memory cell connected to the non-selected WL. In the present invention, a non-selected plate line PL to which negative voltage is applied does not directly contact the bit line BL. Moreover, when 0 V is applied to the second select gate line SG2 of a non-selected page of the present invention and the bit line BL is set to, for example, 0.8 V at writing, a mere voltage of 0.8 V is applied between the gate and the drain, and thus gate induced drain leakage current does not occur.

Accordingly, negative voltage can be applied to the plate line PL of the non-selected page, and thus "1" writing retention characteristics can be significantly extended, and a highly reliable memory device can be provided.

Characteristic 2

The negative voltage applied to the plate line PL in a non-selected state in the dynamic flash memory cell according to the first embodiment of the present invention is automatically generated through reset operation of the page write operation and the page read operation by using capacitive coupling of the first and second select gate lines SG1 and SG2 with the plate line PL. Thus, no negative voltage generation circuit is needed, which leads to significant reduction of electric power consumption. Moreover, the row decoder circuit can be designed to have a compact structure since no decoding of a negative voltage signal is needed. As a result, chip size reduction can be achieved, and thus a low-cost and low-power-consumption memory device can be provided.

Characteristic 3

As for the function of the second gate conductor layer 5b connected to the plate line PL in the dynamic flash memory cell according to the first embodiment of the present invention, the voltages of the first and second select gate lines SG1 and SG2 oscillate when the dynamic flash memory cell performs write and read operation. In this case, the plate line PL functions to reduce the ratio of capacitive coupling between each of the first and second select gate lines SG1 and SG2 and the semiconductor base material 7a. As a result, it is possible to significantly reduce the influence of voltage change of the semiconductor base material 7a when the voltage of the word line WL oscillates. Accordingly, it is possible to increase the difference between SGT transistor threshold voltages of the first and second select gate lines SG1 and SG2, the difference representing logical "0" and "1". This leads to expansion of the operation margin of the dynamic flash memory cell.

Other Embodiments

Although an Si pillar is formed in the present invention, a semiconductor pillar made of a semiconductor material other than Si is applicable. This is the same for other embodiments according to the present invention.

The dynamic flash memory operation can be performed also with a structure in which the polarity of the conduction type of each of the N+ layers 3a and 3b, the P layer, and the Si pillar 2 in FIG. 1 is inversed. In this case, majority carriers in the N-type Si pillar 2 are electrons. Thus, electrons generated through impact ionization are stored in the semiconductor base material 7a to set a "1" state.

The present invention can have various embodiments and modifications without departing from the spirit and scope of the present invention. Each above-described embodiment is only intended to describe an example of the present invention and does not limit the scope of the present invention. Any above-described example and modification may be optionally combined. Some constituent components of the above-described embodiment may be omitted as necessary within the technological idea of the present invention.

With a memory device including a semiconductor element according to the present invention, it is possible to obtain a dynamic flash memory that is a high-density and high-performance memory device including an SGT.

What is claimed is:

1. A memory device including a semiconductor element, the memory device further comprising a memory block formed with a plurality of pages arranged in a column direction, each page being formed with a plurality of memory cells arranged on a substitute in a row direction, wherein each of the memory cells included in each of the pages includes:

a semiconductor base material positioned on the substrate and either standing in a vertical direction or extending in a horizontal direction with respect to the substrate;

a first impurity region and a second impurity region positioned in respective ends of the semiconductor base material;

a gate insulating layer being in contact with a side surface of the semiconductor base material between the first impurity region and the second impurity region;

a first gate conductor layer at least partially covering the gate insulating layer;

a second gate conductor layer positioned adjacent to the first gate conductor layer and being in contact with a side surface of the gate insulating layer; and a third gate conductor layer positioned adjacent to the second gate conductor layer and being in contact with the side surface of the gate insulating layer, further wherein in the memory cell, the first impurity region is connected to a source line, the second impurity region is connected to a bit line, the first gate conductor layer is connected to a first select gate line, the second gate conductor layer is connected to a plate line, and the third gate conductor layer is connected to a second select gate line, a first inter-wiring capacitance is effected between the first select gate line and the plate line, and a second inter-wiring capacitance is effected between the second select gate line and the plate line, a page erase operation, a page write operation, and a page read operation are performed by controlling a voltage applied to each of the source line, the bit line, the first select gate line, the plate line, and the second select gate line, and upon an operation end of one or both of the page write operation and the page read operation, the voltage of the plate line is set to be lower than ground voltage through capacitive coupling of the first inter-wiring capacitance between the first select gate line and the plate line, and the second inter-wiring capacitance between the second select gate line and the plate line.

2. The memory device including a semiconductor element according to claim 1, wherein upon operation end of one or both of the page write operation and the page read operation, the voltage of the plate line is decreased from first voltage that is positive to the ground voltage at a first time point, the voltage of the plate line holds the ground voltage in a floating state at a second time point, the first select gate line and the second select gate line are decreased from second voltage that is positive and third voltage that is positive, respectively, to the ground voltage at a third time point, and the voltage of the plate line is set to fourth voltage that is negative and lower than the ground voltage through capacitive coupling of the first inter-wiring capacitance and the second inter-wiring capacitance.

3. The memory device including a semiconductor element according to claim 1, wherein the ground voltage is 0 volt.

4. The memory device including a semiconductor element according to claim 1, wherein the first select gate line, the plate line, and the second select gate line are disposed in parallel to one another in a plan view, and the bit line is disposed in a vertical direction with respect to the first select gate line, the plate line, and the second select gate line in a plan view.

5. The memory device including a semiconductor element according to claim 1, wherein the total capacitance of gate capacitance between the first gate conductor layer and the semiconductor base material and gate capacitance between the third gate conductor layer and the semiconductor base material is smaller than gate capacitance between the second gate conductor layer and the semiconductor base material.

6. The memory device including a semiconductor element according to claim 1, wherein in a plan view, the source line is separated for each of the memory cells arrayed in the column direction and is disposed in parallel to the first select gate line, the plate line, and the second select gate line.

7. The memory device including a semiconductor element according to claim 1, wherein the source line is connected in common to all of the memory cells of the pages adjacent to each other in a plan view.

8. The memory device including a semiconductor element according to claim 1, wherein the semiconductor base material is a P-type semiconductor layer, and the first impurity region and the second impurity region are N-type semiconductor layers.

9. The memory device including a semiconductor element according to claim 1, wherein all of the memory cells connected to at least two pairs of the pages are erased in the page erase operation.

10. The memory device including a semiconductor element according to claim 1, wherein
in the page erase operation, the number of holes remaining in the semiconductor base material is decreased by annihilating some of the holes in the semiconductor base material in the memory cells of the pages, and
in the page write operation, the number of holes remaining in the semiconductor base material in selected memory cells among the memory cells of the pages is increased through an impact ionization phenomenon or gate induction leakage current.

11. The memory device including a semiconductor element according to claim 1, wherein in the page write operation, a first N-channel MOS transistor region including the first gate conductor layer, and a third N-channel MOS transistor region including the third gate conductor layer are each operated in a linear region, and a second N-channel MOS transistor region including the second gate conductor layer are operated in a saturated region.

12. The memory device including a semiconductor element according to claim 1, wherein in the page write operation, a second N-channel MOS transistor region including the second gate conductor layer, and a third N-channel MOS transistor region including the third gate conductor layer are each operated in a linear region, and a first N-channel MOS transistor region including the first gate conductor layer is operated in a saturated region.

13. The memory device including a semiconductor element according to claim 1, wherein the impact ionization phenomenon occurs inside the semiconductor base material in one or both of the vicinity of a gap between the second gate conductor layer and the third gate conductor layer and the vicinity of a gap between the first gate conductor layer and the second gate conductor layer, and retains the holes inside the semiconductor base material.

14. The memory device including a semiconductor element according to claim 1, wherein voltage equal to or higher than the voltage applied to the plate line is applied to the first select gate line and the second select gate line of each of the memory cells connected to non-selected pages among the pages.

15. The memory device including a semiconductor element according to claim 1, wherein the first gate conductor layer, the second gate conductor layer, and the third gate conductor layer are made of the same material.

* * * * *